(12) United States Patent
Nayler

(10) Patent No.: US 6,423,981 B1
(45) Date of Patent: Jul. 23, 2002

(54) LOW-LOSS ELEMENTARY STANDARD STRUCTURE FOR THE CALIBRATION OF AN INTEGRATED CIRCUIT PROBE

(75) Inventor: Peter Nayler, Grenoble (FR)

(73) Assignee: STMicroelectronics, SA, Crolles (FR)

( * ) Notice: Subject to any disclaimer, the term of this patent is extended or adjusted under 35 U.S.C. 154(b) by 0 days.

(21) Appl. No.: 09/507,991

(22) Filed: Feb. 18, 2000

(30) Foreign Application Priority Data

Feb. 18, 1999 (FR) .............................................. 99 02197

(51) Int. Cl.[7] .............................................. H01L 23/58
(52) U.S. Cl. .......................... 257/48; 257/532; 257/536; 257/659; 257/664
(58) Field of Search .......................... 257/48, 532, 536, 257/664, 659

(56) References Cited

U.S. PATENT DOCUMENTS

| | | | | |
|---|---|---|---|---|
| 4,800,418 A | * | 1/1989 | Natsui .......................... | 257/48 |
| 4,926,234 A | * | 5/1990 | Katoh .......................... | 257/48 |
| 5,111,257 A | | 5/1992 | Andohn et al. ............. | 357/23.4 |
| 5,466,956 A | * | 11/1995 | Aeba ............................. | 257/48 |
| 5,684,301 A | * | 11/1997 | Cresswell ..................... | 257/48 |
| 5,748,006 A | | 5/1998 | Sano ........................... | 324/754 |

FOREIGN PATENT DOCUMENTS

| | | | | |
|---|---|---|---|---|
| DE | 35 02713 A1 | 1/1985 | ........... | H01L/27/04 |
| EP | 0 445 928 A2 | 9/1991 | ............ | G01R/1/04 |
| EP | 0 869 547 | 10/1998 | | |

* cited by examiner

Primary Examiner—Jerome Jackson, Jr.

(57) ABSTRACT

The invention relates to an elementary standard structure for the determining of the RF characteristics of an RF integrated circuit probe, comprising at least two contact pads deposited on a silicon substrate by means of an electrically insulating layer, at least one standard load that is measurable from the contact pads and a conductive screen buried beneath the insulating layer. The invention relates also to a standard circuit comprising a plurality of elementary standard structures arranged so as to present contact pads corresponding by their location to RF connection pads of the integrated circuit to be tested.

17 Claims, 10 Drawing Sheets

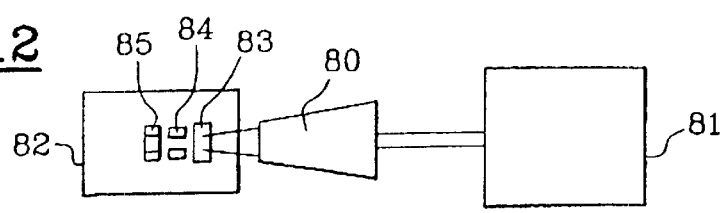
FIG.12
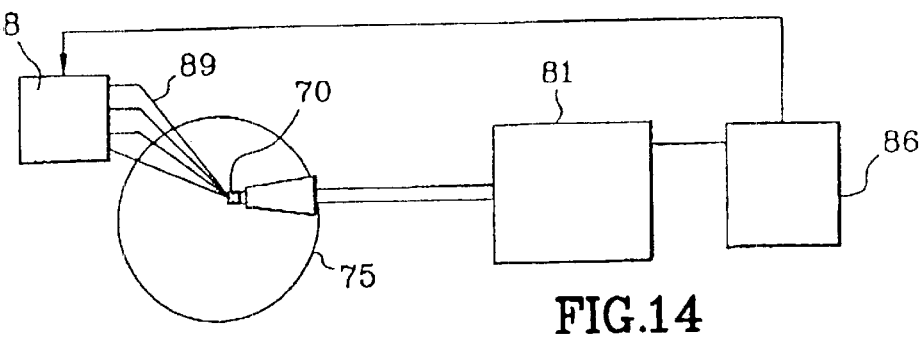
FIG.13
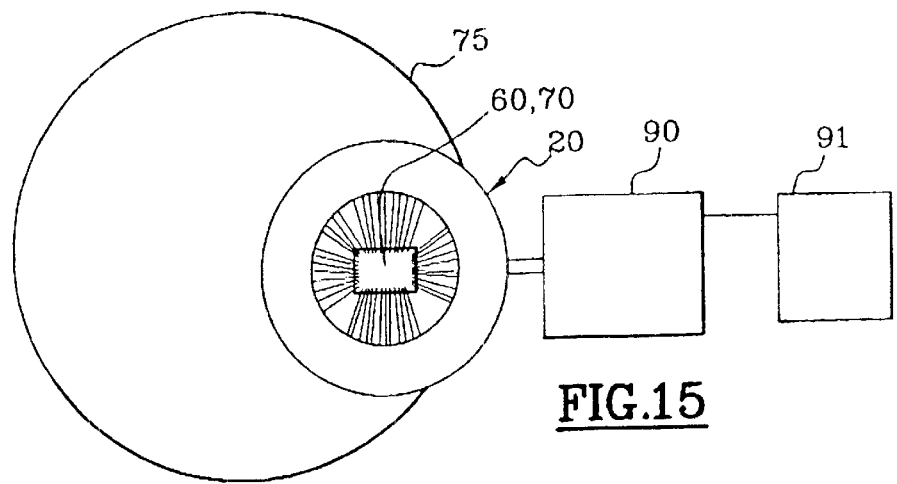
FIG.14
FIG.15

LOW-LOSS ELEMENTARY STANDARD STRUCTURE FOR THE CALIBRATION OF AN INTEGRATED CIRCUIT PROBE

BACKGROUND OF THE INVENTION

1. Field of the Invention

The present invention relates to the electrical testing of so-called RF integrated circuits comprising inputs and outputs designed to receive or deliver AC signals in the radiofrequency domain.

The present invention more particularly relates to the electrical testing of RF integrated circuits present on a silicon wafer before the wafer is sliced into individual components.

2. Description of the Prior Art

By way of an example, FIG. 1 shows a silicon wafer 1 on which a large number of integrated circuits 2 having the same structure have been made by photolithography. The magnified view of FIG. 2 shows an integrated circuit 2 with an active zone 3 and connection pads 4 electrically connected to the active zone 3. A greater magnification of the active zone 3 would reveal hundreds or even thousands of integrated circuits together forming various electronic functions that have to be tested.

Since the manufacturing yields for integrated circuits are below 100%, the electrical testing of the integrated circuits 2 that are still on the wafer 1 makes it possible to identify and reject defective integrated circuits or circuits lacking the expected characteristics, before the slicing of the wafer and the mounting of the individualized integrated circuits in a package or on an interconnection medium. This operation is therefore essential for reducing production costs, especially in the context of mass production.

FIG. 3 gives a schematic view of a conventional system for the testing of integrated circuits and wafers, comprising a test station 11 connected to a probe 12 by means of a harness of electrical cables 13. The probe 12 is a printed circuit card 14 provided with metal tips 15 arranged to coincide with the connection pads of an integrated circuit 2. The wafer 1 is positioned on a tray 16 that is mobile in the horizontal plane and the integrated circuits are tested one after the other by shift motions and rising and descending motions of the tray 16. The entire system is steered by a test program loaded into a memory 17 that determines the electrical characteristics of the test signal to be applied to the integrated circuits and the measurements to be made.

This conventional procedure for the testing of integrated circuits by means of a probe tip card, which is in widespread use in the industry, is nevertheless limited when it is sought to test RF integrated circuits comprising RF inputs/outputs requiring measurement frequencies ranging from some hundreds of MegaHertz to some GigaHertz. These are especially integrated circuits having analog modulation and demodulation functions, mixers, amplifiers, filters, voltage-controlled oscillators (VCOs), phase-locked loops (PLLs), etc. designed for radio receivers, television receivers, mobile radiotelephones, GPS receivers, etc. In this frequency domain, the electrical signals have short wavelengths and various phenomena of reflection and phase rotation appear in the probe 12 and in the conductors 13 connecting the probe to the test station 11. These phenomena of reflection and rotation distort the electrical measurements by creating interference and changes of electrical level. Furthermore, at high frequency, the copper tracks of the printed circuit card 14 and the probe tips 15 of the probe 12 have non-negligible parasitic capacitance and inductance.

To overcome these drawbacks, specialized firms have developed RF probes offering satisfactory characteristics at high frequency. In particular, the firm Cascade™ Microtech in Oregon, 97005 USA, proposes RF probe tips ("transmission line probes") referenced "Air Coplanar" and RFIC membrane probe cards provided with microstrip HF conductors and contact bumps made of nickel. Probes of this kind offer a passband of several tens of Gigahertz, a low reflection coefficient S11 and a transmission coefficient S12 with an attenuation of less than 3 dB (see presentation of Cascade™ products on http//www.cmicro.com).

At the same time, the manufacturers of measuring instruments such as the firm Teradyne™ have developed test stations (the A580 series) having RF ports fitted out with an integrated network analyzer or vector network analyzer capable of determining the "S" parameters (S11, S12/S21 and S22) of a probe by the OSL (open, short, load) method. As is well known to those skilled in the art, the OSL method consists of the performance of three measurements by the successive application, to the output of the probe, of at least three standard loads, generally an infinite impedance (open circuit), a zero impedance (short circuit) and a 50 ohm impedance (load). On the basis of these three measurements, which are kept in the memory of the instrument, the vector network analyzer determines the "S" parameters of the probe, and the test station, during subsequent measurements, makes an automatic error correction designed to compensate for the influence of these parameters to obtain precise and reliable measurements. At present, the standard loads used are thin-layer circuits on ceramic substrate, calibrated by a national metrology laboratory.

The Applicant has however reached the conclusion that these various means for the electrical testing of RF integrated circuits do not enable the implementation of a satisfactory "on-line" testing method.

Firstly, the Air Coplanar type RF transmission line probes require a manual setting of the orientation of tips and are reserved for laboratory measurements or small production outputs. The membrane probe cards provided with contact bumps, although they are specially designed for the testing of integrated circuits on wafers, require the use of standard circuits with specific high-cost thin layers in order to be calibrated. For various other practical reasons, the Applicant believes that the membrane probe cards are not appropriate for the mass production of integrated circuits where the numbers of units manufactured could amount to several millions.

Secondly, at each calibration, the tips or contact bumps of the probes are applied forcefully to the connection pads of the standard circuits, so as to break a surface layer of oxide that forms in contact with air and set up a good electrical contact ("cold welding"). The thin-layer standard circuits, apart from their high cost price, are therefore subject to wear and tear and have short lifetimes.

Finally, the thin-layer standard circuits do not have the same thickness as silicon wafers and, in order to be installed, they require an adjusting of the tray 16 (FIG. 3) which is necessarily followed by another adjusting of the tray when the wafer is installed. This drawback is in addition to the fact that the RF probes require several calibration operations during the testing of a batch of chips. These various calibrations imply action by a qualified engineer and take up 5 to 10% of the time devoted to electrical testing.

Thus, a general goal of the present invention is to provide for a method for the calibration of an RF probe that is suited to mass production, and is economical and easy to implement while at the same time being precise and reliable and capable of being implemented, if necessary, by non-skilled staff.

A more particular goal of the present invention is to provide for a standard circuit that has a low cost price and simplifies the calibration of an RF integrated circuit probe.

SUMMARY OF THE INVENTION

This goal is achieved by providing for an elementary standard structure comprising at least two contact pads deposited on a silicon substrate by means of an electrically insulating layer, at least one standard load that is measurable from the contact pads and a conductive screen buried beneath the insulating layer.

According to the invention, a standard circuit is made, comprising a plurality of elementary standard structures having same type standard loads arranged so as to present contact pads corresponding by their location to RF connection pads of the integrated circuit to be tested.

According to one embodiment, the standard circuit comprises a remanent memory connected to contact pads corresponding, by their location, to non-RF connection pads of the integrated circuit to be tested.

According to the invention, there is also made a silicon wafer comprising a plurality of standard circuits according to the invention, or comprising both integrated circuits to be tested and standard circuits according to the invention.

The conductive screen present in each standard structure may be demarcated laterally by etching, or by trenches made in the substrate. According to one embodiment, one of the contact zones of an elementary standard structure is connected to the conductive screen. Furthermore, an elementary standard structure may comprise two standard loads in series, connected by their midpoint to the conductive screen. A standard structure may also comprise at least one contact pad enabling access to the midpoint of the two standard loads. A standard load may be an open circuit formed by two sections of conductive tracks that do not meet, a short-circuit between two sections of conductive tracks, a resistive element connecting two sections of conductive tracks, or again a capacitor comprising a conductive plate deposited on the insulating layer and overhanging the buried conductive screen.

To achieve homogeneity in the electrical characteristics of the standard circuits according to the invention and in the electrical characteristics of RF integrated circuits, the invention also provides for making RF integrated circuits comprising at least one conductive screen buried under two RF connection pads. As above, the conductive screen may be demarcated laterally by etching, or by trenches made in the substrate of the integrated circuit.

Therefore, in practice, a method according to the invention for the calibration of an RF integrated circuit test probe comprises a step for determining the characteristics of the RF transmission lines of the probe, carried out by means of a vector network analyzer and standard circuits according to the invention, present on a silicon wafer.

The present invention also relates to a method for the electrical testing of an RF integrated circuit present on a silicon wafer, by means of a test station provided with RF ports, a network analyzer and a probe, comprising a step for determining the RF characteristics of the probe, carried out by means of standard circuits according to the invention, present on a silicon wafer, the RF characteristics of the probe being used as corrective terms during the electrical testing of the integrated circuit.

BRIEF DESCRIPTION OF THE DRAWINGS

These goals, characteristics and advantages of the present invention as well as others shall be explained in greater detail in the following description of the method of the invention and various exemplary embodiments of standard structures and circuits according to the invention, with reference to the appended figures, of which:

FIGS. 12, 13, 14 and 15 illustrate a method, according to the invention, for the calibration of an RF test probe;

DETAILED DESCRIPTION

As stated in the introduction, the general goal of the invention is to carry out the electrical testing of the RF integrated circuits on silicon wafers in an industrial environment, in a manner that is simple, fast and inexpensive, while at the same time obtaining precise and reliable measurements. The present invention comprises various aspects that shall be described independently of each other.

Making of a Low-cost RF Probe

Figure 1:
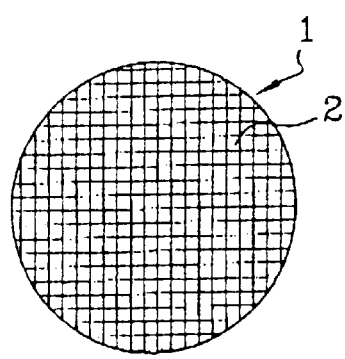
FIG. 1 described here above shows a silicon wafer comprising integrated circuits.
Figure 2:
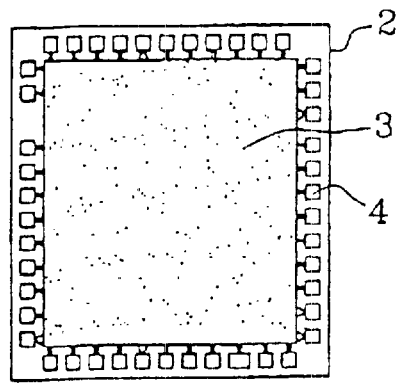
FIG. 2 shows an integrated circuit on the wafer of FIG. 1.
Figure 3:
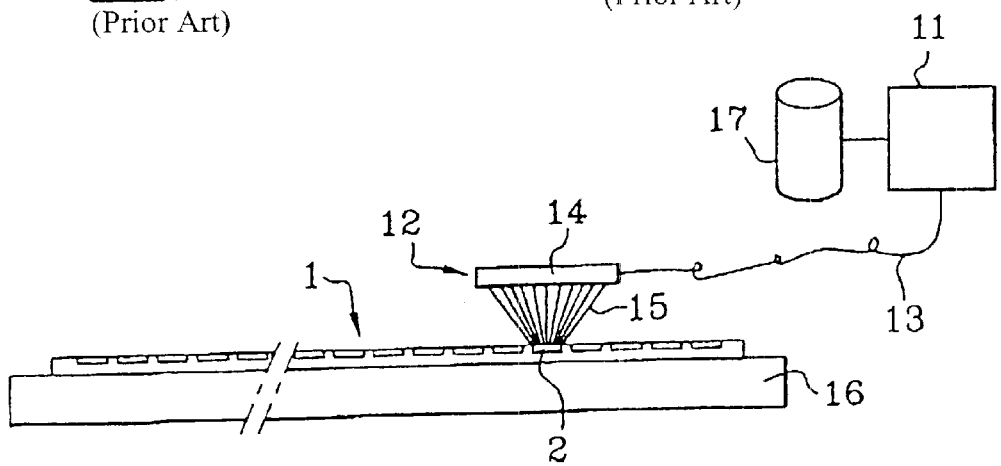
FIG. 3 shows a conventional system for the testing of a non-RF integrated circuit.
Figure 4:
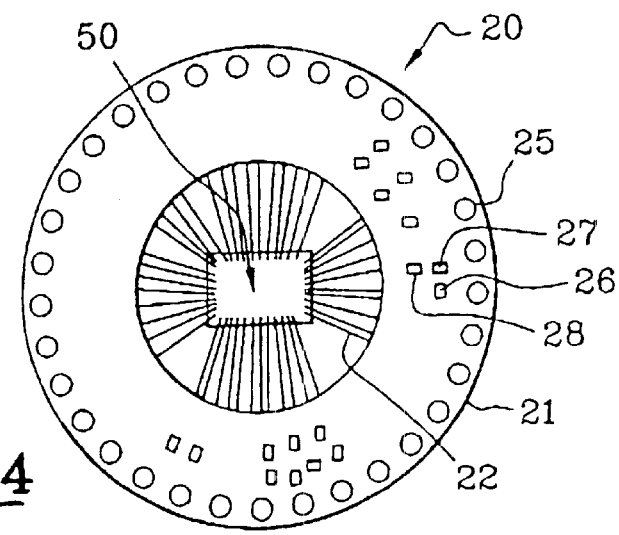
FIG. 4 is a top view of an RF integrated circuit according to the invention.

According to one aspect of the invention illustrated in FIG. 4, the RF integrated circuits are electrically tested by means of a probe 20 comprising a printed circuit 21 provided with metal probe tips 22. The printed circuit is ring-shaped and the tips 22, oriented towards the center of the structure, are arranged so as to coincide with the connection pads of an integrated circuit 50. The probe 20, through its structure, is similar to the conventional printed-circuit probes but has RF transmission lines providing satisfactory characteristics at high frequency. As shall be seen further below, these characteristics will be measured in the form of "S" parameters and compensated for by conventional error correction techniques. The probe 20 is thus an alternative to the HF membrane probe cards. It is optional but advantageous in its flexibility of use and cost price for measurement frequencies in the low level of the RF domain ranging from hundreds of megahertz to some Gigahertz. Since most present-day RF integrated circuits work in this frequency range, the probe 20 can be used to cover almost all industrial-scale needs.

Figure 5:
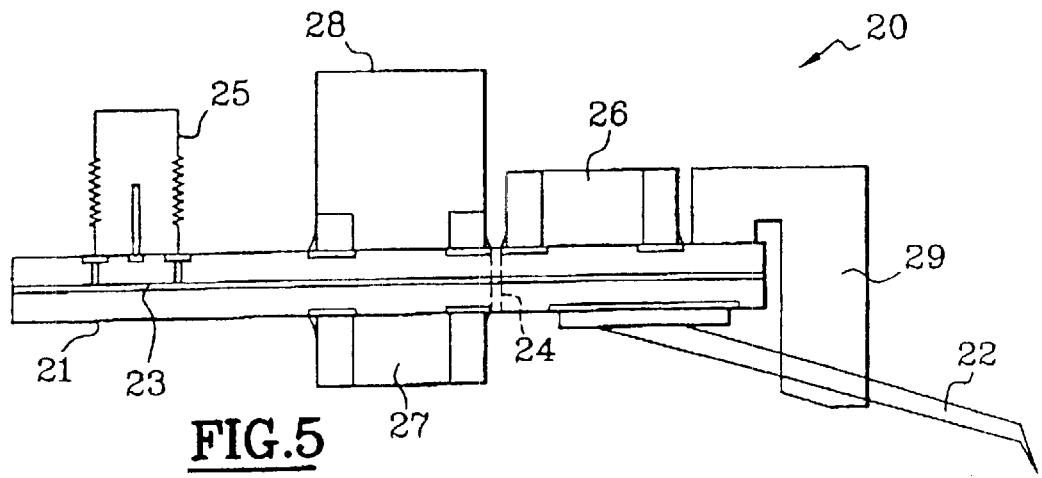
FIG. 5 is a sectional view of the probe according to the invention.

As shown schematically in the sectional view of FIG. 5, the printed circuit 21 is a multilayer circuit preferably having a buried and uninterrupted ground plane 23, metallized via holes 24 to connect the various conductive levels and RF type connectors 25. The probe tips 22, which have a small length of about 3 to 9 mm, are soldered by their base to the printed circuit 21 and are held by an electrically insulating part 29 forming a sort of crown extending beneath the printed circuit 21. Furthermore, the printed circuit 21 has passive components 26, 27 on both its sides. These are components such as capacitors and inductors, enabling the matching of the impedance values of the transmission lines of the probe 20 connecting the connectors 25 to the probe tips 22. The printed circuit 21 also has transformers 28 to deliver symmetrical signals enabling the testing of the balanced inputs of an integrated circuit.

Figure 6:
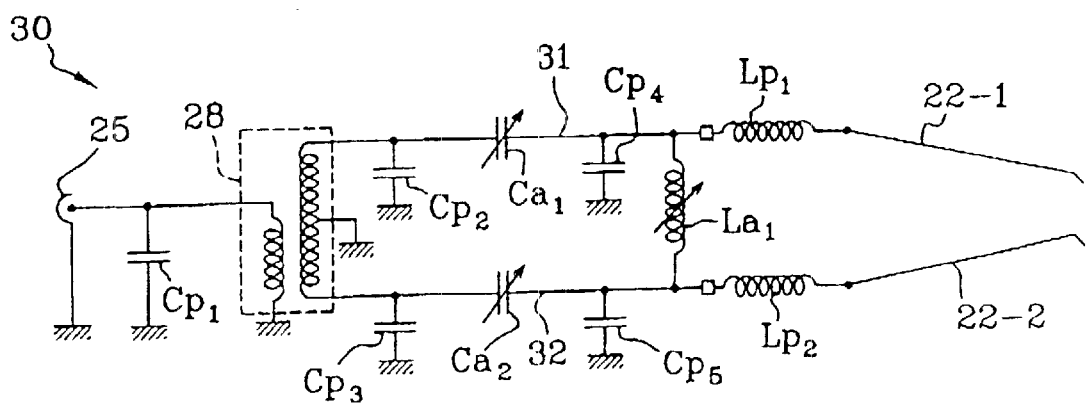
FIGS. 6 and 7 are electrical diagrams of RF transmission lines of the probe according to the invention.

To give a clearer picture, FIG. 6 shows the electrical diagram of an embodiment of a transmission line 30 designed to test balanced inputs of-an integrated circuit. The line 30 comprises two conductive tracks 31, 32 of the printed circuit 21 that lead to two tips 22-1, 22-2. The tracks 31, 32 are connected to terminals of the secondary winding of a transformer 28 whose midpoint is connected to the ground, the primary winding of the transformer being connected to a connector 25. The tracks 31, 2 each have a series-mounted matching capacitor Ca1, Ca2 and are connected by a matching inductor La1. The capacitors Ca1, Ca2 and the inductor La1 enable compensation for the influence of parasitic elements present in the transmission line 30, especially a parasitic capacitance Cp1 present between the primary winding of the transformer 27 and the ground, parasitic capacitances Cp2, Cp3 present between each terminal of the secondary winding and the ground, parasitic capacitances Cp4, Cp5 present between each tip 22-1, 22-2 and the ground and the parasitic inductances Lp1, Lp2 of the tips 22-1, 22-2. More specifically, the matching capacitors Ca1, Ca2 and the inductor La1 enable the resonance frequency of the transmission line 30 to be adjusted in such a way that the probe 20 behaves like a <<transparent window>> enabling access to an integrated circuit.

Figure 7:
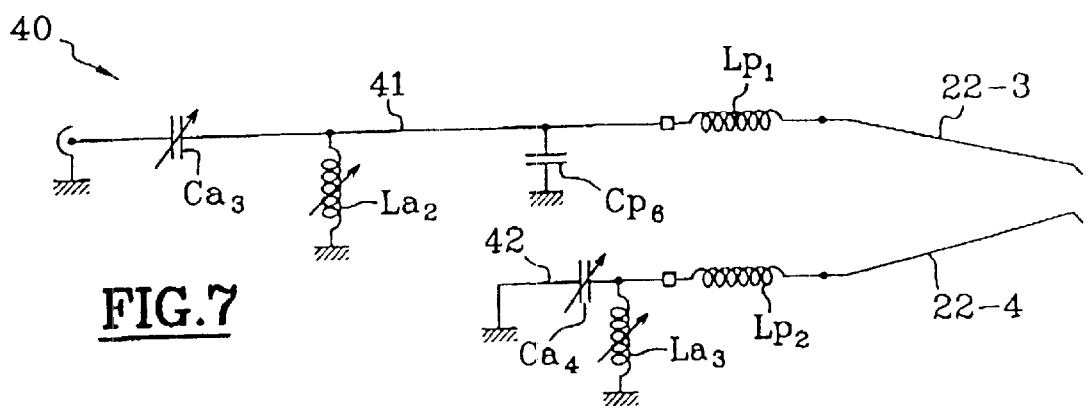

Similarly, FIG. 7 represents the electrical diagram of an embodiment of a non-symmetrical transmission line 40 designed to test single-ended inputs of an integrated circuit. The transmission line 40 has a (signal) phase track 41 and a (reference) ground track 42 that is conductive at tips 22-3, 22-4. The phase track 41 and the ground track 42 are each provided with a series-mounted matching capacitor Ca3, Ca4 and are connected to the ground by an inductor La2, La3. As here above, these components enable compensation for the influence of parasitic elements Lp1, Lp2, Cp6 present in the transmission line.

The probe 20 shall not be described in greater detail. Its making is per se within the scope of those skilled in the art and requires the application of conventional rules in the field of high-frequency circuits. The fact of using a printed-circuit probe for the testing of RF integrated circuits nevertheless remains an optional aspect of the present invention that is combined with the calibration method described further below for obtaining a testing method that is simple to implement and suited to mass production.

Making of standard circuits

Figure 8:
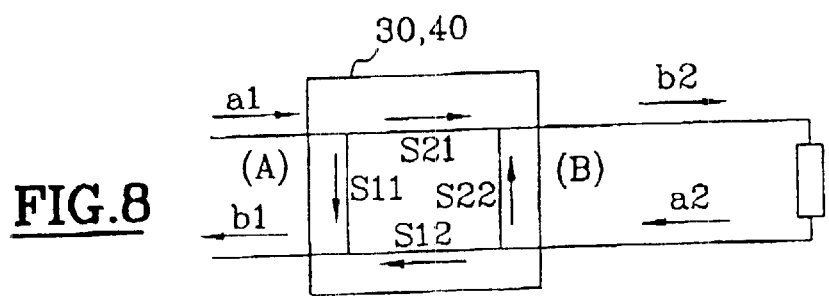
FIG. 8 illustrates an equivalent diagram in a form of an RF network of a RF transmission line.

A description shall now be given of the standard circuits according to the invention enabling the calibration of the probe 20 by the OSL ("open", "short", "load") method. It is recalled first of all, with reference to FIG. 8, that the RF transmission lines of the probe 20, for example the lines 30 and 40 shown in FIGS. 6 and 7, may be represented in the form of an RF network with two ports A, B comprising, seen from the port A, a reflection parameter S11 and a transmission parameter S21 and, seen from the port B, a reflection parameter S22 and a transmission parameter S12. If al designates an incident wave sent to the port A, b1 designates the wave sent by the port A, b2 designates the wave sent to the port B and a2 designates the wave reflected by the load Z to which the port B is connected, then the network is defined by the following relations:

$$b1 = a1\ S11 + a2\ S12 \quad (1)$$

$$b2 = a1\ S21 + a2\ S22 \quad (2)$$

The network being passive and linear, the coefficients S12 and S21 are considered equal. Furthermore, the load Z has a coefficient of reflection $\Gamma z$ that is governed by the conventional relation:

$$\Gamma z = a2/b2 = Z - Z0/Z + Z0 \quad (3)$$

in which Z0 is the characteristic impedance of the transmission line between the network and the load Z.

The combination of the relations (1), (2) and (3) gives the following relation:

$$\Gamma n = b1/a1 = (S11 + (S21^2 \Gamma z)/(1 - S22\ \Gamma s)) \quad (4)$$

in which $\Gamma n$ is the coefficient of reflection of the network seen from the port A. The relation (4) has three unknown quantities. If we measure the coefficient of reflection $\Gamma n$ from the port A with three standard loads Z1, Z2, Z3 connected to the port B, in particular an infinite load (open circuit), a zero load (short circuit) and a load Z3 with a known value, the relation (4) makes it possible, for a given frequency, to determine the parameters S11, S21 and S22 of the network. These parameters are complex numbers represented by a real term and an imaginary term or by an amplitude and a phase.

In practice, the "S" parameters of each of the RF transmission lines of the probe 20 will be determined by means of a vector network analyzer after three measurements requiring the successive connection of the probe tips 22 to at least three standard loads Z1, Z2, Z3. The problem posed by the calibration of the probe 20, and generally the calibration of an RF probe, designed to be applied to an integrated circuit, is essentially practical and related to the large number of transmission lines to be calibrated and to the fact that numerous calibration operations are needed during the electrical testing of a batch of integrated circuits.

According to the invention, it is proposed to make standard loads in the form of a standard circuit on a silicon substrate reproducing the layout diagram of the connection pads of the integrated circuit to be tested. This standard circuit will enable the calibration of all the RF transmission lines of the probe 20 in a limited number of handling operations.

Figure 9A:
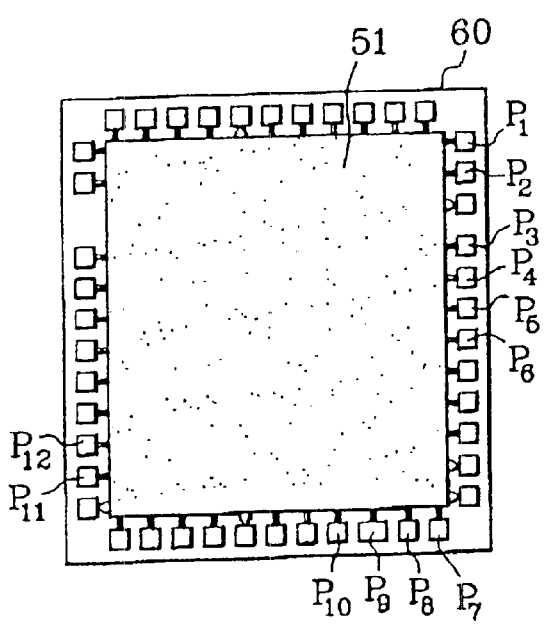
FIG. 9A shows an RF integrated circuit.

As an example, FIG. 9A shows an integrated circuit 50 comprising an active zone 51 and aluminum connection pads. Among these connection pads, there are the connection pads P1, P2, P3, . . . , P12 corresponding to RF inputs/outputs of the integrated circuit. These inputs/outputs may be of the single-ended type or of the balanced type. The other connection pads, that are not referenced in the figure, are non-RF connection pads corresponding to low-frequency inputs/outputs (logic signals) or to DC inputs/outputs (bias voltages, supply voltages, etc.).

Figure 9B:
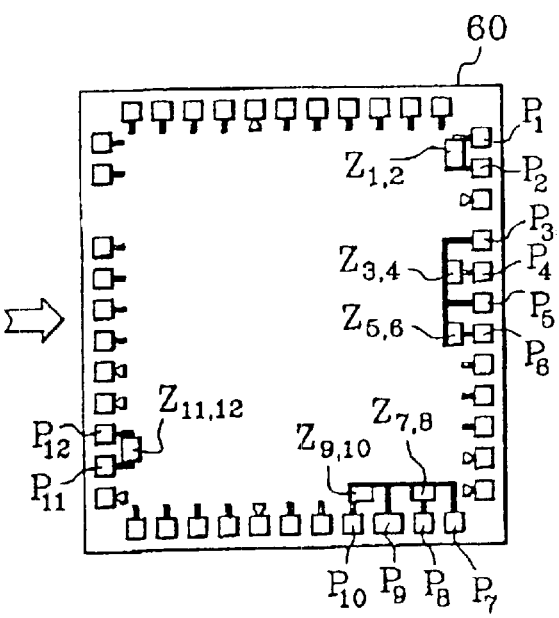
FIGS. 9B and 9C show two standard circuits according to the invention.

FIG. 9B shows a standard circuit 60 according to the invention made on a silicon substrate. The circuit 60 is a sort of dummy integrated circuit 50 that does not have the active zone 51 and in which there are the RF and non-RF connection pads of the integrated circuit 50. The connection pads P1 to P12 corresponding to the RF pads having the same reference of the circuit 50 are connected in sets of two to an elementary standard load, respectively $Z_{1,2}$, $Z_{3,4}$, $Z_{5,6}$, $Z_{7,8}$, $Z_{9,10}$, $Z_{11,12}$. The non-RF pads remain without connection. Each pair of pads P1/P2, P2/P4, ..., P11/P12 thus forms, with the standard load Z that is associated with it, an elementary standard structure on a silicon substrate, exemplary embodiments of which shall be described further below.

Figure 9C:
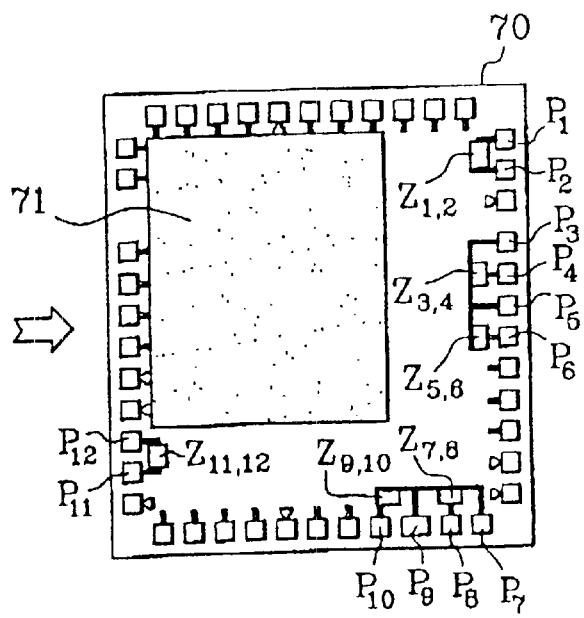

FIG. 9C shows an alternative embodiment in which the standard circuit, referenced 70, furthermore has an active zone 71 connected to the non-RF pads. The active zone 71 is a remanent type memory, for example an EEPROM memory comprising floating gate transistors, enabling the storage of the values of the elementary standard loads Z present at the terminals of the RF pads P1 to P12.

According to the invention, at least three standard circuits 60 are made on a silicon wafer. These three standard circuits 60 are differentiated from each other by the characteristic impedance of the standard loads Z that they comprise. The first standard circuit, which is an "O" (open) type circuit, comprises non-connected RF pads, the loads Z then being impedances that are presumed to be infinite. The second standard circuit, which is of an "S" (short) type circuit comprises RF pads short-circuited in sets of two by means of metallic tracks, the loads Z being zero value resistors. The third standard circuit, which is an "L" (load) type circuit has RF pads connected in sets of two by a resistor. Preferably, there are also provided "C1" and "C2" type standard circuits in which the loads Z are capacitors or inductors. These complementary, optional standard circuits will enable verification of the calibration results as shall be seen further below.

Figure 10:
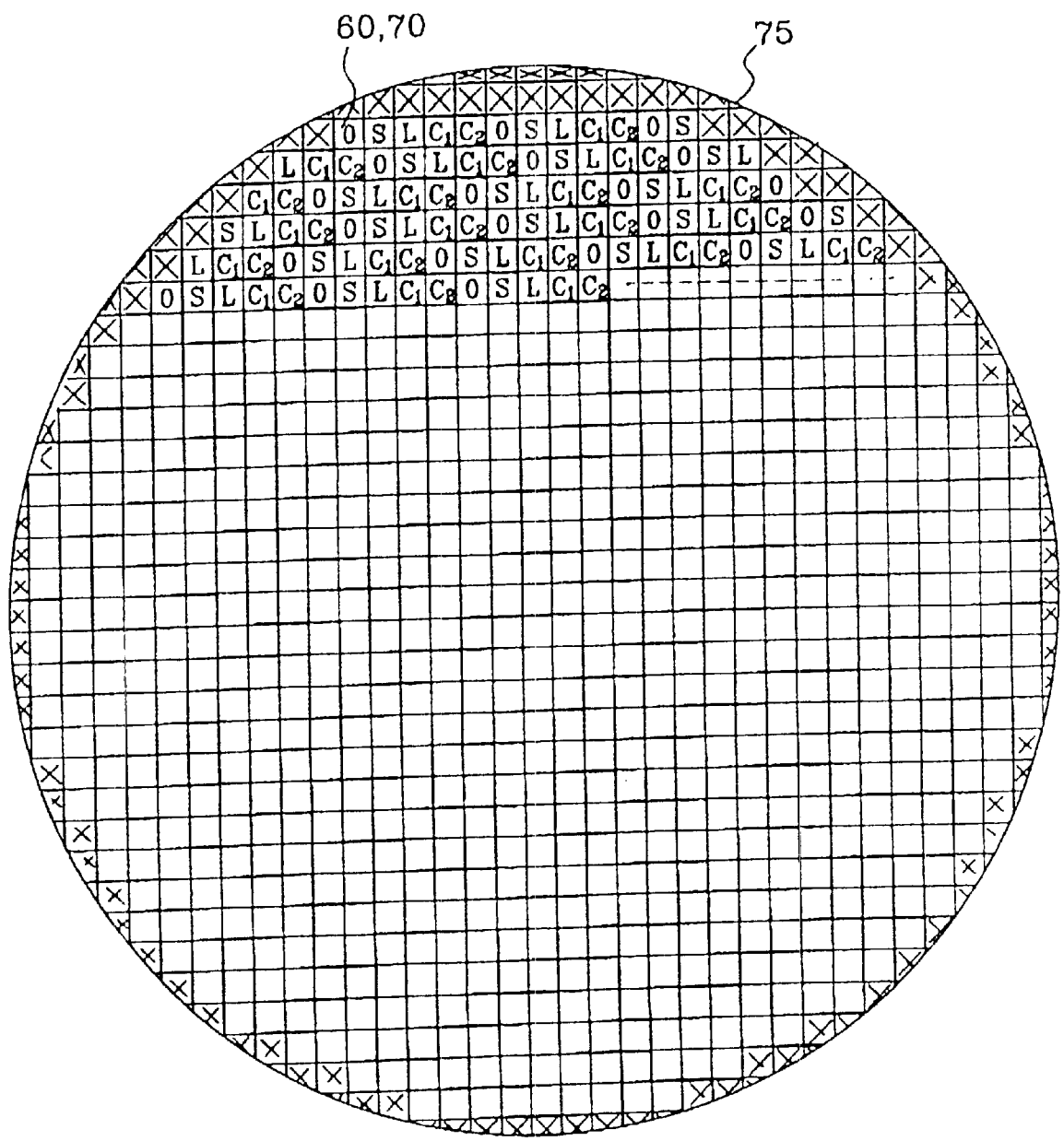
FIGS. 10 and 11 show a silicon wafer with standard circuits according to the invention.
Figure 11:
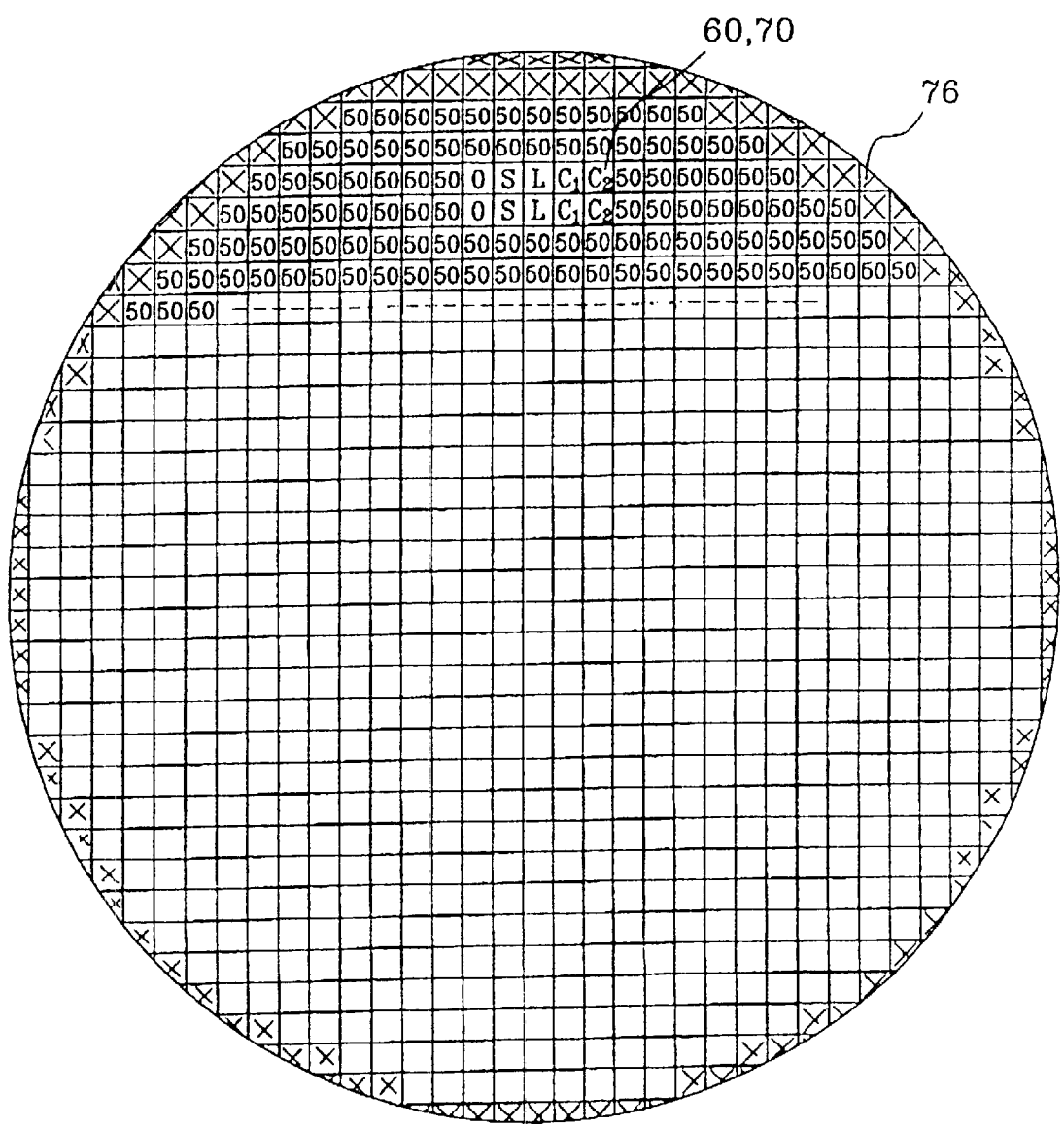

FIGS. 10 and 11 illustrate two embodiments of a wafer according to the invention. In FIG. 10, the wafer 75 has only "0", "S", "L", "C1" and "C2" type standard circuits 60 or 70 that succeed each other and take up the entire useful surface of the wafer. In FIG. 11, the wafer 76 is a "product" wafer comprising integrated circuits 50 designed to be tested and commercially distributed as well as a few standard circuits 60 or 70 laid out in place of certain integrated circuits 50. In the example shown, the wafer 76 has two rows of five "O", "S", "L", "C1" and "C2" type standard circuits taking the place of ten integrated circuits 50.

Through the invention, there are thus standard circuits 60 or 70 (FIGS. 9B, 9C) of the same shape and size as the integrated circuits 50 to be tested (FIG. 9A) laid out on a wafer 75 having the same thickness as the "product" wafer (FIG. 10) or laid out on the "product" wafer 76 itself (FIG. 11). These standard circuits have elementary standard structures with contact pads that coincide with the tips of the probe 20 (FIG. 4), dedicated to the electrical testing of the integrated circuits 50. As shall be seen here below, these elementary standard structures will be used as transfer standards for the conveying to the places of production, where the electrical testing of the integrated circuits is done, of a calibration reference given by thin layer circuits on ceramic calibrated by a national metrology laboratory.

Implementation of a Calibration Method Consisting of a "Transfer of Standards" to the Production Places In a first step, shown schematically in FIG. 12, two RF probe tips 80 are calibrated by means of a measuring bench 81 and a thin layer circuit 82 comprising O, S, L type standard structures 83, 84, 85 calibrated by a certified laboratory. The tips 80 are for example Cascade™ Microtech probe tips in the Air Coplanar series. The measuring bench 81 is provided with a conventional vector network analyzer of the kind commonly available in the market. The S parameters measured by the network analyzer are used to calibrate the measuring system up to the end of the probe tips 80.

During a step for the calibration of the calibration circuits according to the invention, shown schematically in FIG. 13, the wafer 75 (FIG. 10) is placed on the work tray and the RF probe tips 80 are used to measure the electrical characteristics of each elementary standard structure of each standard circuit 60 present on the wafer. The measurement is done at several frequencies, for example five frequencies, chosen as a function of the nominal frequency F0 of the integrated circuits to be tested later. For example, frequencies of 780, 790, 800, 810 and 820 MHz are chosen for integrated circuits having a nominal frequency of 800 MHz. The measuring bench 81 delivers the measurement results to a computer 86. These results are recorded on a support 87, for example a diskette, which will subsequently accompany the wafer 75 to a production site. The measurements are presented in the form of N files of the type described by the following table, each file giving the coefficient of reflection and the phase of an elementary standard load $Z_{1,2}$, ..., $Z_{11,12}$ of an O, S, L, C1, or C2 type standard circuit. The files may be recorded in the "S1P" format known to those skilled in the art.

FIG. 14 gives a schematic view of a variant of the calibration step in which the standard circuits 70 present on the wafer 75 each have a remanent memory 71, as described further above with reference to FIG. 9C. In this case, the files containing the values of the elementary standard loads $Z_{1,2}$, ..., $Z_{11,12}$ are stored in the memory 71 instead of being recorded on a diskette. The memory is programmed in a manner known per se by means of a programmer 88 receiving the values to be recorded from the computer 86. The programmer 88 is connected to the non-RF contact pads of the circuit 70 by means of probe tips 89.

TABLE examples of files

| Circuit | Type | File | Measurement | Measurement |
|---|---|---|---|---|
| Standard Circuit No 1 | "O" ("open") | $Z_{1,2}$ File | F0 | $\Gamma = 0.95$ $\phi = -15°$ |
| | | | F0 + 10 MHz | $\Gamma = 0.94$ $\phi = -16°$ |
| | | | F0 − 10 MHz | $\Gamma = 0.96$ $\phi = -14°$ |
| | | | F0 + 20 MHz | $\Gamma = 0.93$ $\phi = -17°$ |
| | | | F0 − 20 MHz | $\Gamma = 0.97$ $\phi = -13°$ |
| | | $Z_{3,4}$ File | F0 | $\Gamma = 0.95$ $\phi = -15°$ |
| | | | F0 + 10 MHz | $\Gamma = 0.95$ $\phi = -16°$ |
| | | | F0 − 10 MHz | $\Gamma = 0.95$ $\phi = -14°$ |
| | | | F0 + 20 MHz | $\Gamma = 0.95$ $\phi = -17°$ |
| | | | F0 − 20 MHz | $\Gamma = 0.96$ $\phi = -13°$ |
| | | ... | ... | ... |
| | | $Z_{11,12}$ File | F0 | $\Gamma = 0.95$ $\phi = -15°$ |
| | | | F0 + 10 MHz | $\Gamma = 0.95$ $\phi = -16°$ |
| | | | F0 − 10 MHz | $\Gamma = 0.95$ $\phi = -14°$ |
| | | | F0 + 20 MHz | $\Gamma = 0.94$ $\phi = -17°$ |
| | | | F0 − 20 MHz | $\Gamma = 0.96$ $\phi = -14°$ |
| Standard Circuit No 2 | "S" ("short") | $Z_{1,2}$ File | F0 | $\Gamma = 0.98$ $\phi = +20°$ |
| | | | F0 + 10 MHz | $\Gamma = 0.97$ $\phi = +25°$ |
| | | $Z_{3,4}$ File ... | ... | ... |
| | | ... | ... | ... |
| | | $Z_{11,12}$ File ... | ... | ... |

TABLE-continued examples of files

| Circuit | Type | File | Measurement | Measurement |
|---|---|---|---|---|
| Standard Circuit No 3 | "L" ("Load") | $Z_{1,2}$ File ... | F0 ... | $\Gamma = 0.02$ $\phi = +21°$ ... |
| ... (etc.) | ... | ... | ... | ... |

When the calibration step is completed, the standard wafer 75 is sent to a production site that may be located at several thousands of kilometers from the place where it was calibrated. On the production site, as shown schematically in FIG. 15, an RF test station 90 connected to a computer 91 and the probe 20 already described are available. The probe 20 is connected to the RF and non-RF ports of the station 90 by coaxial or other types of cables. The cables connected to the RF ports are calibrated beforehand by the OSL method using commercially available standard loads. The probe 20 is calibrated by means of three O, S and L type standard circuits 60, 70 chosen on the wafer 75 from among all the standard circuits available. Preferably, the standard circuits are used only for a specified number of times because of the deterioration of the contact pads through the test probe tips and the search for an optimum electrical contact. Furthermore, depending on whether the standard circuits 60, 70 present on the wafer 75 have an integrated memory 71 or not, the elementary standard impedance values $Z_{1,2}$, $Z_{3,4}$, ..., $Z_{11,12}$ are given by the diskette 87 (FIG. 13) or are read directly in the integrated memory 71 by means of the probe 20. Naturally, instead of a diskette, the data elements may be transmitted by means of a computer network.

Thus, the probe 20 is applied successively to three standard circuits, and the station 90 measures the coefficients of reflection Γn of various RF transmission lines of the probe. At the end of three steps, the network analyzer of the station 90 is capable of determining the S parameters of the RF transmission lines of the probe. These parameters are kept in the memory as parameters for the correction of the measurements performed subsequently during the electrical testing of the RF integrated circuit present on a product wafer.

The calibration method according to the invention is simple and fast to implement. All that it requires is the mounting of the wafer 75 on the test tray (chuck) and the successive positioning of the probe 20 on three standard circuits. The method of the invention may be entirely automated and may not require the intervention of a qualified RF engineer.

In one alternative mode of the method of the invention, the calibration of the probe is done by means of the standard circuits present on a "product" wafer 76 shown in FIG. 11. In this case, the elementary standard loads of the standard circuits may be calibrated beforehand, according to the method shown in FIGS. 12 and 13, by means of a measuring bench mounted in the silicon-wafer manufacturing halls. In another approach envisaged by the Applicant, the test station 90 is given estimated values of the elementary standard loads deduced from a large number of measurements made on other wafers. This estimative method, when rigorously conducted, is capable of further simplifying the calibration of the RF integrated circuit probe.

Furthermore, before the wafer 75 is removed, the "C1" and "C2" type complementary standard circuits can be used to verify that the probe is rightly calibrated and to detect any isolated error. If the impedance values of the "C1" and "C2" type circuits measured with the probe 20 do not correspond to the values given by the reference measuring bench (FIG. 13 or 14), it is possible to generate an alarm signal to bring an operator into action. The operator will clean the probe or perform a new calibration.

Making of Elementary Standard Structures with Low Losses

A description shall now be given of an aspect of the invention relating to the elementary standard structures present in the O, S, L and C1 or C2 type standard circuits. Silicon, owing to its semiconductor properties, is deemed unsuitable for making standard loads. This is why conventional standard loads have until now been made in thin films on ceramic substrate. However, owing to the method of the invention described further above, which enables a transfer of standards to be carried out, it is not sought here to obtain high-quality standard impedances that behave as pure resistors. It will be sought simply to make standard impedances whose measurable values are stable in time, insensitive to the environment and especially to various electrical parasites that may rise from the chuck. It is also sought to make standards with low RF losses and low stray capacitance.

Figure 16A:
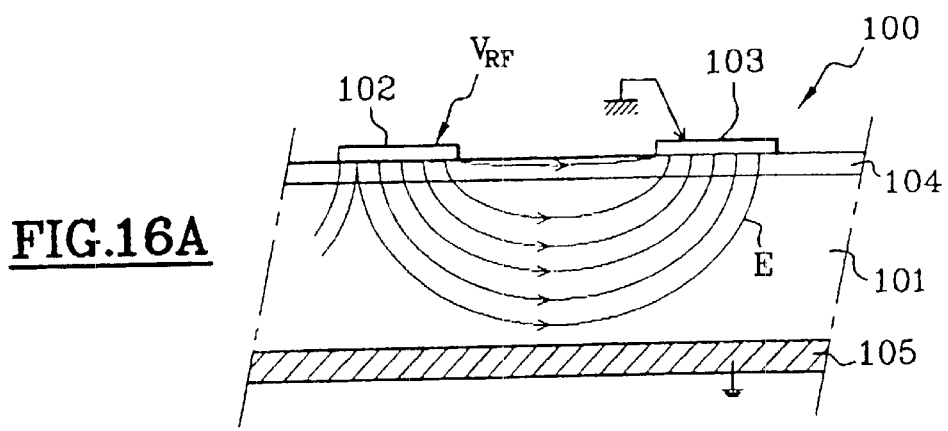
FIGS. 16A and 17A are sectional views of two elementary standard structures and illustrate an aspect of the invention.
Figure 16B:
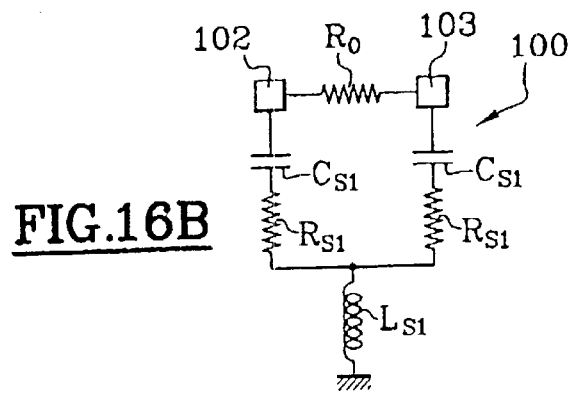
FIGS. 16B and 17B are electrical diagrams of the standard structures of FIGS. 16A and 17A.

To provide a clear picture, FIG. 16A gives a sectional view of an O (open circuit) type elementary standard structure 100 made on a silicon substrate 101, in particular a silicon wafer. The structure 100 has two contact pads 102, 103 deposited on the substrate 101 by means of an electrically insulating layer 104, for example a silicon oxide. It is assumed here that the substrate is placed on a metal tray 105 connected to the ground. The application of a voltage VRF between the pad 102 and the pad 103 causes the appearance of an electrical field E that radiates in the thickness of the substrate 101 and leads to electrical losses by the standard structure. Furthermore, the equivalent electrical diagram of FIG. 16B shows that the pads 102, 103, between which there is a resistor R0 representing the open circuit, are connected to the ground by means of a circuit C, R, L comprising a parasitic capacitor Cs1, the electrical resistor Rs1 of the substrate and a leakage inductor Ls1 of the metal tray 105 connected to the test equipment. The capacitor Cs1 has a high value because its electrodes are formed throughout the surface of the substrate, which extends well beyond the standard structure. Thus, if the ground of the instrument delivering the voltage $V_{RF}$ is not insulated from the ground, as is generally the case, a ground loop will appear, promoting the rise of electrical parasites in the standard structure 100. The standard structure 100 just described is therefore not entirely satisfactory. This would also be the case if the pads 102, 103 were connected by a short-circuit or a resistor.

Figure 17A:
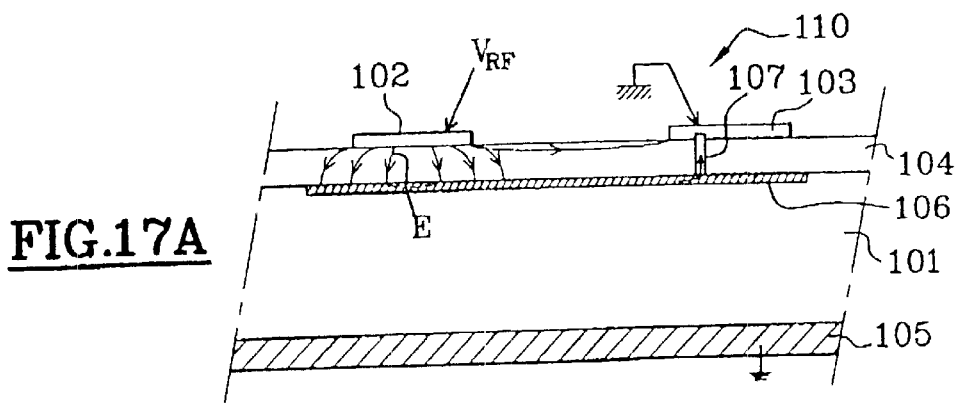
Figure 17B:
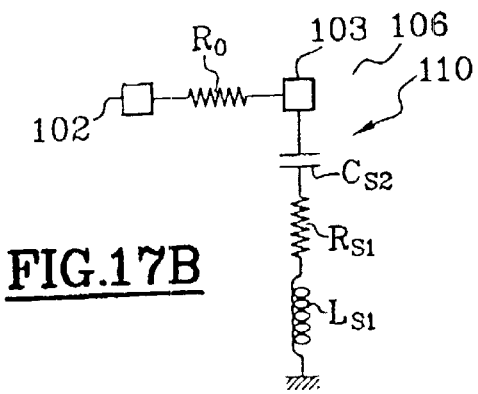

FIG. 17A is a sectional view of a standard structure 110 according to the invention which can be distinguished from the previous one by the fact that a conductor screen 106 is buried beneath the oxide layer 104. The screen 106, made of metal, polycrystalline silicon or highly doped silicon, is connected to the pad 104 (ground) by conductive vertical connections 107 going through the oxide layer, filled with highly doped silicon or metal. The screen 106 extends on an area that is limited as compared with the surface area of the substrate but nevertheless underlies the entire area occupied by the standard structure so that the contact pads 102, 103 overhang the screen 106. Thus, the electrical field E is confined between the pad 102 and the screen 106 and the electrical losses are reduced. Furthermore, the equivalent electrical diagram of FIG. 17B shows that the pad 102 is insulated from the substrate 101 and the metal tray 105. The pad 103 remains connected to the ground by means of a capacitor Cs2, the resistor Rs1 and the inductor Ls1 of the metal tray 105. However, the capacitance of the capacitor Cs2 is far smaller than that of the capacitor Cs1 of FIG. 16B for its electrodes are defined by the size of the screen 106 which is far smaller than that of the substrate. The standard structure 110 is therefore more satisfactory than the structure 100. A description shall be given further below of the balanced type standard structures in which the conductive screen forms a vertical ground. These structures are considered by the inventors to be entirely satisfactory and entirely protected against parasitic influences. Generally, it is important that the conductive screen 106 should be at a "cold" RF potential. In other words, the screen should not receive the phase of the measurement signal and should be connected to the ground pad or should form a virtual ground.

A description shall now be given of exemplary standard structures comprising other characteristics according to the invention.

Figure 18:
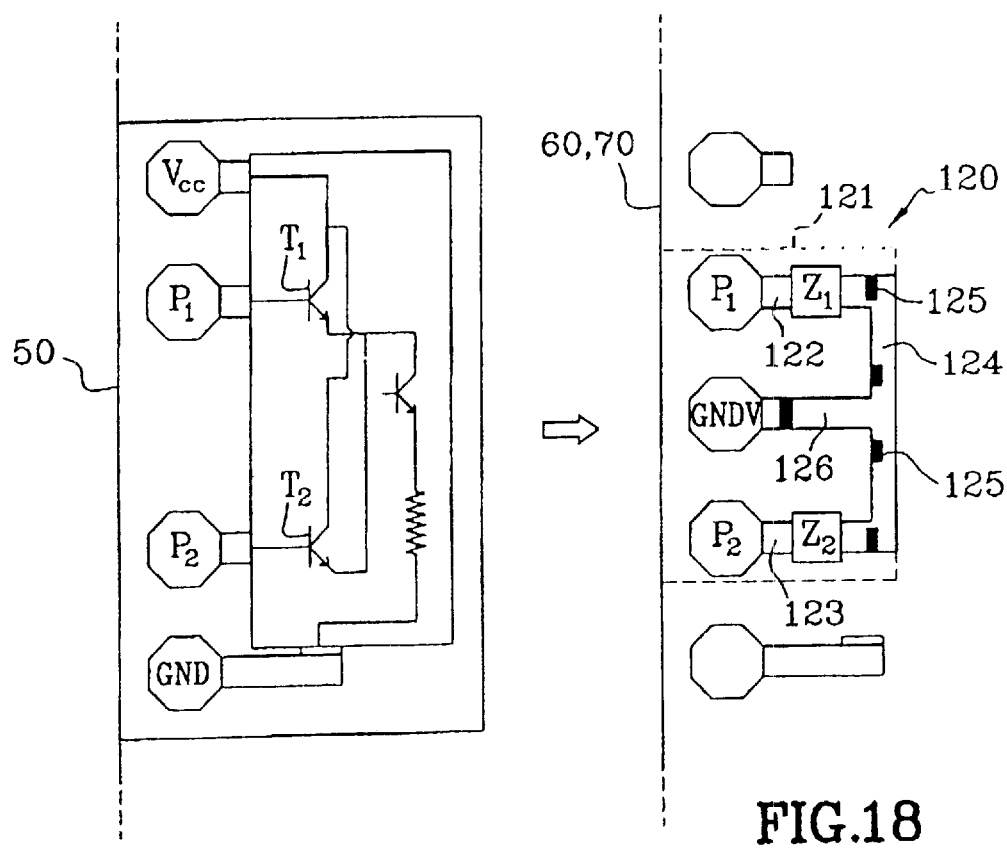
FIGS. 18, 19, 20, 22 and 23 are top views of various embodiments of elementary standard structures according to the invention.
Figure 19:
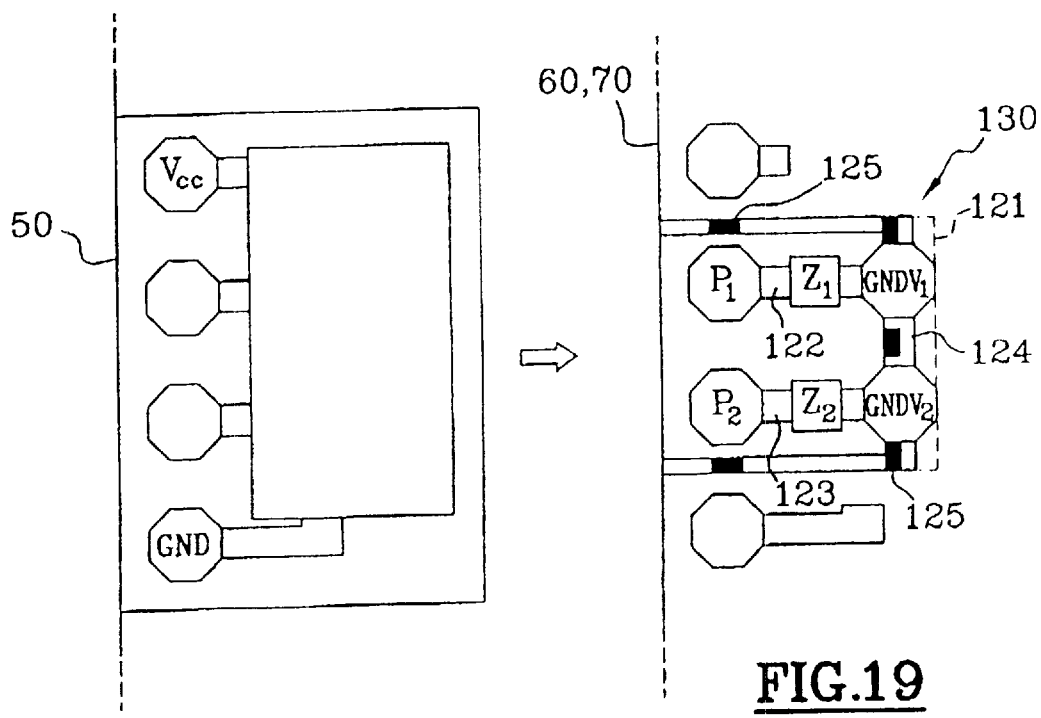

FIGS. 18 and 19 show two elementary standard structures 120, 130 (in the right-hand part of the figures) and the initial arrangement of the connection pads on the integrated circuit 50 (left-hand part of the figures). These standard structures 120, 130 are of a symmetrical type and are designed for the calibration of symmetrical transmission lines (FIG. 6) enabling the testing of the balanced inputs of the integrated circuit. During the calibration of the probe, the structures 120, 130 will thus receive a symmetrical signal. However, the Air Coplanar type RF transmission line probes used for the calibration of the standard structures (the step of FIG. 13) cannot perform measurements in balanced mode for reasons inherent to their high-frequency structure. The standard structures 120, 130 resolve this drawback as shall now be seen.

In the left-hand part of FIG. 18, the integrated circuit 50 has, for example, a power supply Vcc pad, a ground GND pad and two pads P1, P2 corresponding to a balanced input shown schematically by an assembly of two common-emitter transistors T1, T2. In the right-hand part of the Figure, the elementary standard structure 120 has two pads P1, P2 and is demarcated by a conductive screen 121 buried beneath an insulating layer whose edges are represented by dashes. The pads P1, P2 are each connected to a load Z1, Z2 by conductive track sections 122, 123. The loads Z1, Z2 are shown in the form of a square location that may be left vacant (open circuit) or receive a conductive material, for example an aluminium deposit in a particular shape, wide or narrow (constituting a short circuit or a resistor) or a resistive material such as doped silicon (to constitute a resistor). At their other ends, the loads Z1, Z2 are connected to each other by a third track section 124. The track section 124 is itself connected to the screen 106 by conductive vertical connections 125 crossing the insulating layer. Furthermore, the section 124 is extended in its central part in the form of an arm 126 leading to a virtual ground pad GNDV positioned between the pads P1, P2 in the alignment of these pads.

Thus, during the measurement step illustrated in FIG. 13, a measurement is made first of all of the load Z1 by placing the tips 80 on the pads P1 and GNDV. The load Z2 is then measured by means of the pads P2 and GNDV. The elementary standard load for the calibration of a differential transmission line is computed by taking the sum of the two loads Z1 and Z2.

It follows from the above that a standard circuit according to the invention may include additional measurement pads that are not seen in the initial diagram of the integrated circuit to be tested. These pads have not been shown in FIGS. 9B and 9C with a view to simplicity.

The elementary structure 130 of FIG. 19 is distinguished from the structure 120 by the fact that two virtual ground pads GNDV1, GNDV2 are laid out so that they face the pads P1 and P2, on the other side of the loads Z1, Z2, the pads P1 and P2 being too close to each other to allow the insertion of a measurement pad. The track section 124 connects the pads GNDV1, GNDV2 and extends beyond these pads to go along the area occupied by the screen 121 and ensure efficient connection to this screen 121 by means of various conductive vertical connections 125. Here, the load Z1 is measured between the pads P1 and GNDV1 and the load Z2 is measured between the pads P2 and GNDV2.

Figure 20:
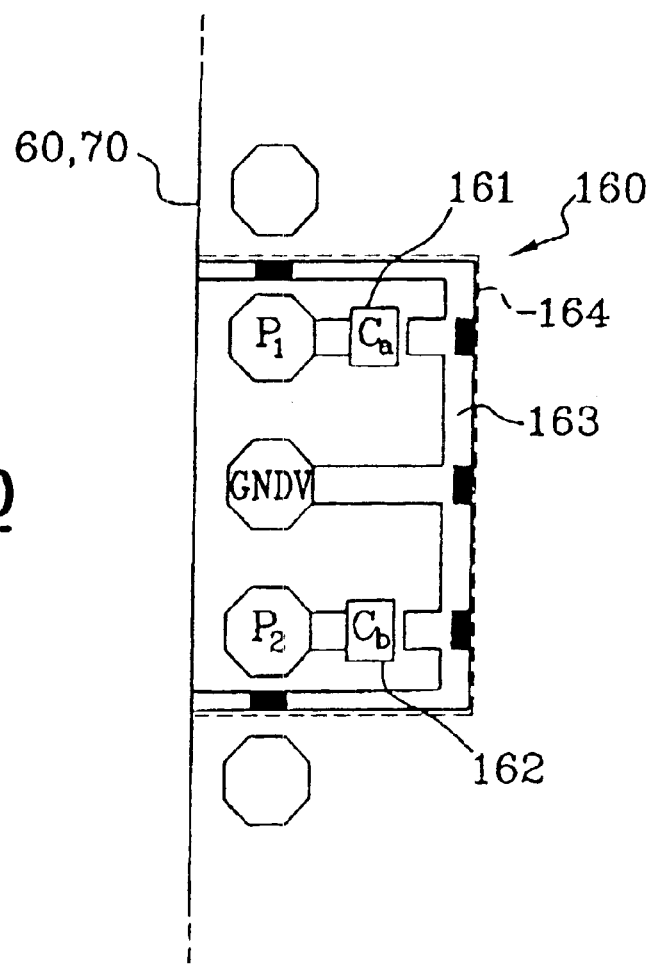
Figure 21:
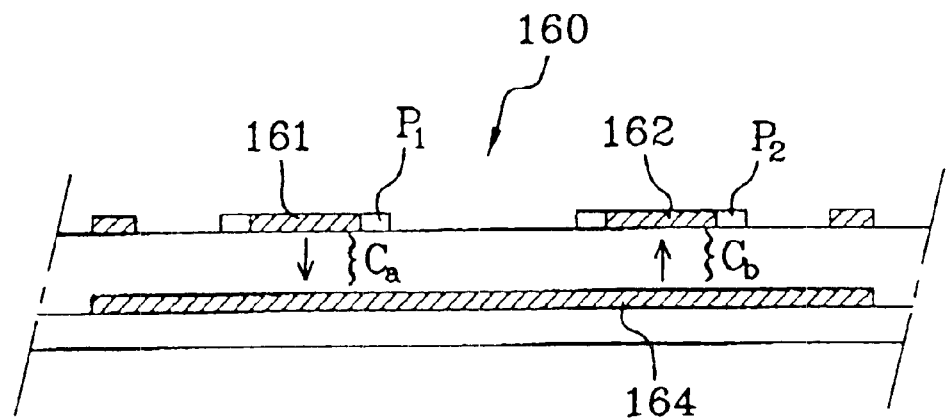
FIG. 21 is a sectional view of the standard structure of FIG. 20.

FIG. 20 shows a C1 or C2 type symmetrical standard structure 160. This structure 160 greatly resembles an S type structure that will be made in accordance with FIG. 18, the elementary loads being formed by squares of conductive material, or plates 161, 162, connected to the pads P1, P2. However, in this case, the plates 161, 162 do not come into contact with the central track section 163 (the track section 163, connected to the buried screen 164, is preserved because the structure 160 is made in the same way as the O, S or L type structure). Thus, as shall be seen more clearly in the sectional view of FIG. 21, the plates 161, 162, with the buried conductor screen 164, form two series-connected capacitors Ca, Cb. The total impedance of the structure 160 is a capacitor whose value depends on the size of the plates 161, 162.

Figure 22:
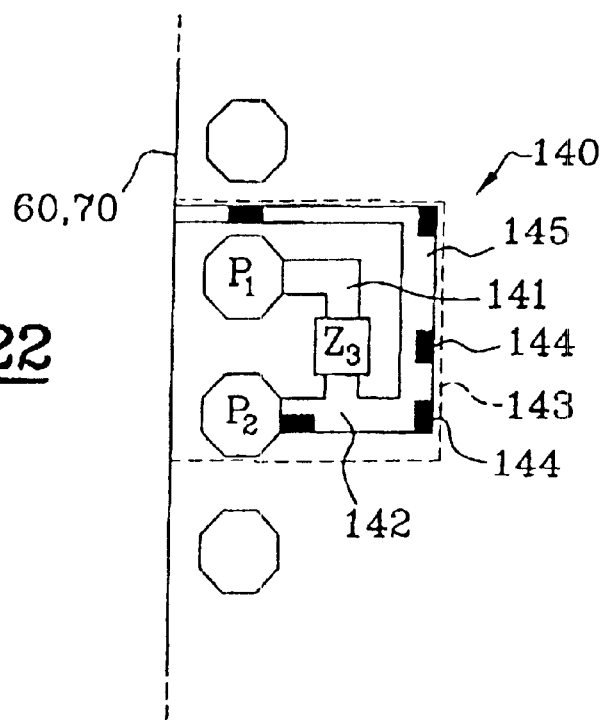

FIG. 22 shows a non-symmetrical type elementary standard structure 140 wherein the pad P1 is designed to receive the phase and the pad P2 is designed to receive the ground of a measurement signal. The pad P1 is connected to a load Z3 by a track section 141 and the pad P2 is connected to the other end of the load Z3 by a track section 142. The track section 142 is connected to a buried conductive screen 143 by means of conductive vertical connections 144 positioned especially along an arm 145 running along the area occupied by the screen 143.

Figure 23:
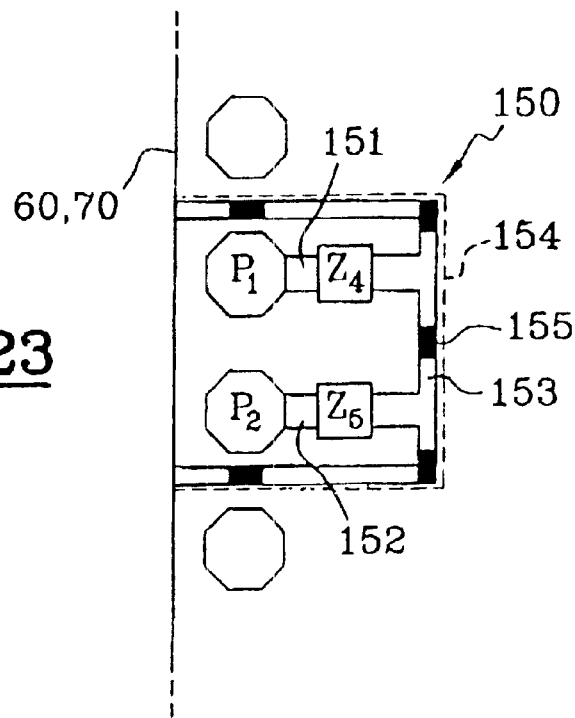

Finally, FIG. 23 shows a symmetrical structure 150 in which the pad P1 is connected by a track section 151 to a load Z4 and the pad P2 is connected by a track section 152 to a load Z5. A track section 153 connects the loads Z4, Z5 whose sum forms the standard impedance. Here, only the track section 153 is connected to a buried screen 154 by conductive vertical connections 155. The screen 154 therefore forms a virtual ground although the structure has no virtual ground pad.

Non-symmetrical type capacitive standard structures may also be made according to the teaching of FIG. 20, the loads Z3 or Z4 and Z5 then taking the form of conductive pads connected only to the pads P1, P2. Similarly, the inductive structures may be made by means of metallic patterns in the form of flat coils.

Technological Aspects of the Standard Structures According to the Invention

In practice, the standard structures according to the invention are preferably made by means of the same technology as the corresponding integrated circuit. Thus, for example, the "HSB2" (or high-speed bipolar) technology used for the manufacture of RF integrated circuits enables the making, in the substrate, of insulating trenches reaching highly doped buried layers or epitaxial silicon layers. In this case, first of all a conductive layer that covers the entire substrate is made by ion bombardment or silicon epitaxy in the presence of a dopant. After the deposition of one or more oxide layers and the making of the other elements, trenches are made around each standard structure according to the invention in order to cut out the buried conductive layer and cause the appearance, under each elementary structure, of an insulated conductive screen insulated from the rest of the conductive layer. Another mode of operation, that is more conventional per se, consists of the etching of the buried layer before the deposition of the oxide layer so as to leave only the conductive screens.

Extension of the Use of a Conductive Screen

As can clearly be seen by those skilled in the art, it is advantageous for a standard circuit according to the invention to have electrical properties that approach those of the integrated circuit to be tested as closely as possible. Thus, it is within the scope of the present invention to make integrated circuits, for example the circuit 50 of FIG. 9A, having a conductive screen beneath each pair of RF pads. The providing of a screen of this kind can only improve the performance characteristics of the high-frequency screen by reducing its electrical losses. The screen is laid out as shown by any of the FIGS. 18 to 23, depending on whether the pads of the integrated circuit correspond to symmetrical inputs/outputs or to non-symmetrical inputs/outputs. The screen may be connected to the ground pad in the case of a non-symmetrical input. In the case of a balanced input, the screen may be connected to the midpoint of the load as seen from the connection pads. This midpoint is for example the connection point of the emitters of the transistors Ti, T2 shown in FIG. 18.

Summary and Scope of the Invention

Here above a description has been given of various aspects of the invention that work together for a common result, namely the improvement, rationalization and simplification of the electrical testing of RF integrated circuits. The first aspect of the invention relates to the optional use of an RF probe made from a printed circuit, as a replacement for standard membrane probes. The second aspect relates to the making of standard circuits on silicon having contact pads that coincide with the connection pads of an integrated circuit to be tested and therefore with the probe tips or contact bumps of a probe designed to test the integrated circuits. The third aspect of the invention relates to the calibration of a test probe by means of these standard circuits used as transfer standards. The fourth aspect of the invention relates to the making of low-loss standard structures on silicon comprising a buried screen, and to the extension of the buried screen to the RF integrated circuits themselves.

Finally, the fifth aspect of the invention relates to embodiments of elementary standard structures, especially symmetrical structures, comprising additional contact pads to be calibrated with non-symmetrical RF probe tips. It will clearly seen by those skilled in the art that these various aspects of the invention are independent of each other although their combination forms an advantageous whole enabling the general goal of the invention to be achieved more directly.

While the invention has been particularly shown and described with reference to a preferred embodiment, it will be understood by those skilled in the art that various changes in form and detail may be made therein without departing from the spirit and scope of the invention.

What is claimed is:

1. An elementary standard structure for determining RF characteristics of an RF integrated circuit probe, comprising at least two contact pads deposited over a silicon substrate on an electrically insulating layer, at least one standard load measurable from the contact pads, and a conductive screen buried beneath the insulating layer and extending beneath both the standard load and the contact pads, the conductive screen forming an electrical shield limiting RF substrate losses.

2. A standard structure according to claim 1, wherein the conductive screen is laterally demarcated by etching.

3. A standard structure according to claim 1, wherein the conductive screen is laterally demarcated by trenches made in the substrate.

4. A standard structure according to claim 1, wherein one of the contact pads is connected to the conductive screen.

5. A standard structure according to claim 1, wherein the at least one standard load is one of two standard loads connected in series and connected at the series connection to the conductive screen.

6. A standard structure according to claim 5, comprising at least one additional contact pad to access the series connection between the two standard loads.

7. A standard structure according to claim 1, wherein the at least one standard load is one or more of an open circuit, a short circuit, a resistive load, and a capacitive load.

8. A standard structure according to claim 1, wherein the at least one standard load is an open circuit between two sections of conductive tracks.

9. A standard structure according to claim 1, wherein the at least one standard load is a resistive element connecting two sections of conductive tracks.

10. A standard structure according to claim 1, wherein the at least one standard load is a capacitor comprising a conductive plate deposited on the insulating layer and overhanging the buried conductive screen.

11. A standard circuit for measurement of RF characteristics of an RF integrated circuit test probe, comprising a plurality of elementary standard structures according to claim 1, each elementary standard structure including at least one standard load selected from an open circuit O, a short circuit S, a resistive load L, and one or more capacitive loads C1 and C2, each standard load connected to contact pads corresponding in location within a die containing the standard circuit to RF connection pads of an integrated circuit to be tested.

12. A standard circuit according to claim 11, furthermore comprising a remanent memory connected to contact pads corresponding in location within the die to non-RF connection pads of the integrated circuit to be tested.

13. A silicon wafer, comprising a plurality of standard circuits according to claim 11.

14. A silicon wafer, comprising both integrated circuits to be tested and standard circuits according to claim 11.

15. A method for the calibration of an RF integrated test probe comprising a step of determining characteristics of RF transmission lines of the probe by means of a vector network analyzer and standard circuits, wherein the determining step is achieved by means of standard circuits present on a silicon wafer, each standard circuit including a plurality of elementary standard structures having at least one standard load connected to contact pads corresponding in location within a die containing the standard circuit to RF connection pads of an integrated circuit to be tested.

16. A method for electrical testing of an RF integrated circuit present on a silicon wafer, by means of a test station provided with RF ports, a network analyzer and a probe, comprising a step for defining RF characteristics of the probe, carried out in accordance with the method of claim 15, wherein the RF characteristics of the probe are used as corrective terms during the electrical testing of the integrated circuit.

17. A standard structure according to claim 1, wherein the conductive screen limits RF substrate losses during calibration of the RF integrated circuit probe.

* * * * *